(12) United States Patent
Murakami et al.

(10) Patent No.: US 10,116,302 B1
(45) Date of Patent: Oct. 30, 2018

(54) SEMICONDUCTOR DEVICE

(71) Applicant: Mitsubishi Electric Corporation, Tokyo (JP)

(72) Inventors: Haruhiko Murakami, Tokyo (JP); Rei Yoneyama, Tokyo (JP); Masayuki Ando, Tokyo (JP); Hiroyuki Okabe, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/872,099

(22) Filed: Jan. 16, 2018

(30) Foreign Application Priority Data

Jun. 12, 2017 (JP) .................................. 2017-114850

(51) Int. Cl.
| | |
|---|---|
| *G05F 1/56* | (2006.01) |
| *H03K 17/687* | (2006.01) |
| *H02M 7/537* | (2006.01) |
| *G05F 1/46* | (2006.01) |
| *H03K 17/082* | (2006.01) |
| *H03K 17/08* | (2006.01) |

(52) U.S. Cl.
CPC ........... *H03K 17/687* (2013.01); *G05F 1/463* (2013.01); *H02M 7/537* (2013.01); *H03K 17/0822* (2013.01); *H01L 2924/13055* (2013.01); *H01L 2924/13091* (2013.01); *H03K 2017/0806* (2013.01); *H03K 2217/0063* (2013.01); *H03K 2217/0072* (2013.01); *H03K 2217/0081* (2013.01)

(58) Field of Classification Search
CPC ....................................................... G05F 1/56

USPC .......................................... 323/282–289, 315
See application file for complete search history.

(56) References Cited

U.S. PATENT DOCUMENTS

| | | | | |
|---|---|---|---|---|
| 5,900,714 | A * | 5/1999 | Dubhashi | H02P 6/28 |
| | | | | 318/811 |
| 9,780,648 | B2 * | 10/2017 | Tsyrganovich | H02M 3/156 |
| 2002/0063546 | A1 * | 5/2002 | Takahashi | G05B 11/28 |
| | | | | 318/599 |
| 2004/0196678 | A1 | 10/2004 | Yoshimura et al. | |
| 2006/0077697 | A1 * | 4/2006 | Yang | H02M 3/33507 |
| | | | | 363/21.13 |

(Continued)

FOREIGN PATENT DOCUMENTS

| | | |
|---|---|---|
| JP | 2000-134074 A | 5/2000 |
| JP | 2004-312817 A | 11/2004 |

*Primary Examiner* — Adolf Berhane
*Assistant Examiner* — Nusrat Quddus
(74) *Attorney, Agent, or Firm* — Studebaker & Brackett PC

(57) ABSTRACT

A high-side switching element is provided between a main output terminal having an intermediate potential and a high-side terminal. A signal transmission circuit includes a first point, a second point, a signal switching element, and a diode. The intermediate potential is applied to the first point. A referred potential between the low-side potential and the high-side potential is applied to the second point. The signal switching element has a first end connected to the first point and a second end, and is switched in accordance with a conversion signal. The diode is provided between the second point and the second end of the signal switching element and has a direction with which a forward current can flow by a voltage between the first point and the second point in a case where the intermediate potential is the low-side potential.

13 Claims, 11 Drawing Sheets

(56) References Cited

U.S. PATENT DOCUMENTS

| | | | |
|---|---|---|---|
| 2007/0103134 A1* | 5/2007 | Yang | H02M 3/33523 323/282 |
| 2012/0169313 A1* | 7/2012 | Lee | H02M 1/4225 323/282 |
| 2016/0223397 A1* | 8/2016 | Tsai | G01J 1/44 |

* cited by examiner

F I G. 7
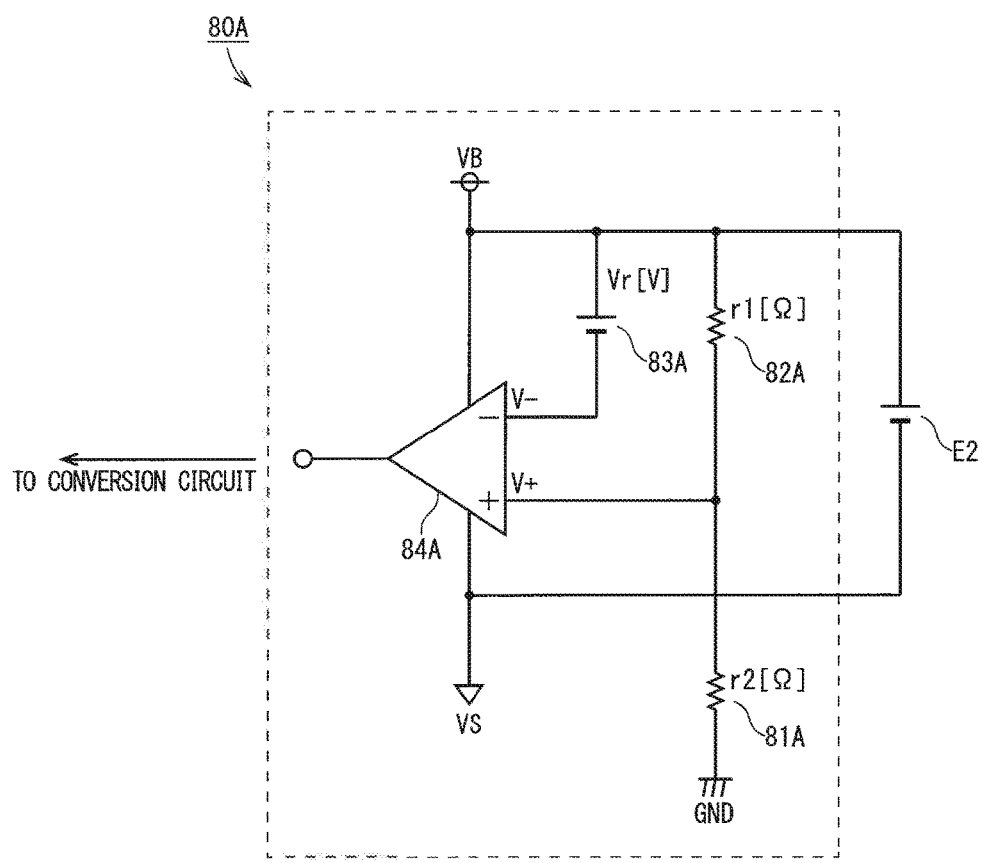

F I G. 1 4
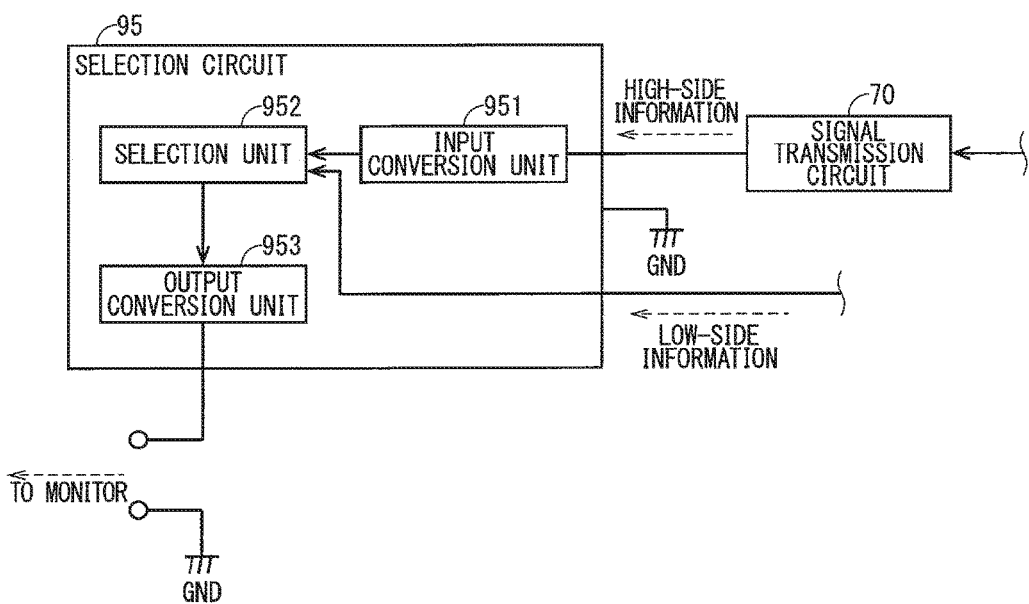

SEMICONDUCTOR DEVICE

BACKGROUND OF THE INVENTION

Field of the Invention

The present invention relates to a semiconductor device, and particularly to a semiconductor device including a detection circuit to detect condition information of a high-side switching element.

Description of the Background Art

A power semiconductor device referred to as an intelligent power module (IPM) is widely used for driving an inverter. The IPM includes a protection circuit in addition to a drive circuit for driving a semiconductor switching element such as an insulated gate bipolar transistor (IGBT) and a metal oxide semiconductor field effect transistor (MOSFET). As a typical operation of the protection circuit, when a temperature of the semiconductor switching element rises excessively, a protection operation, protecting the semiconductor switching element by blocking a drive signal from the drive circuit, is performed, and an error signal notifying that the protection operation has been performed is output outside. For example, according to Japanese Patent Application Laid-Open Publication No. 2000-134074, a semiconductor module includes a semiconductor element, a temperature detection element provided on the semiconductor element for measuring a temperature of the semiconductor element, a temperature detection means of creating temperature information using the temperature detection element, an analog insulation amplifier for transmitting the temperature information being output from the temperature detection means to a part where electric potential differs, and a selection means which inputs the pieces of temperature information being output from the large number of analog insulation amplifiers and then selects and outputs the temperature information of the part where the temperature of the semiconductor element is the highest among the pieces of temperature information.

When a low-side switching element and a high-side switching element are driven as a semiconductor switching element, a high voltage integrated circuit (HVIC) including a low-side drive circuit and a high-side drive circuit is needed in the IPM. The high-side drive circuit is separated from the low-side drive circuit at a high voltage. Accordingly, in order to transmit a control signal, which is input to the HVIC to determine a timing of a switching operation, to the high-side drive circuit, an upshift for raising reference potential of the control signal is necessary. For the purpose described above, the HVIC includes a level-shift circuit having an upshift function of performing a shift from the low side to the high side. In the meanwhile, a signal transmission from the high side to the low side is not necessarily needed for the switching operation itself, but is necessary to achieve various functions such as the protective operation described above. For example, Japanese Patent Application Laid-Open Publication No. 2004-312817 describes a configuration that an HVIC includes not only a built-in level-shift circuit for transmitting a signal from a low side to a high side but also a built-in level-shift circuit for transmitting a signal from the high side to the low side. According to the above publication, the above configuration is inexpensive and has high reliability compared to a configuration of using a photo-coupler for transmitting the signal.

As described above, widely applied is a configuration that the HVIC includes the built-in level-shift circuit for performing the upshift from the low side to the high side. In the meanwhile, it is practically difficult to make the HVIC further include the built-in level-shift circuit for performing a downshift with sufficiently high reliability to transmit the signal from the high side to the low side. Japanese Patent Application Laid-Open Publication No. 2004-312817 described above does not also disclose any specific configuration of the level-shift circuit, so that it is unclear how the downshift is implemented. In the meanwhile, as is also described in the above publication, the signal transmission from the high side to the low side can be performed using the photo-coupler without using the level-shift circuit. However, the photo-coupler increases a size of the IPM.

SUMMARY OF THE INVENTION

The present invention has been made to solve the above-mentioned problems and an object of the present invention is to provide a small-sized semiconductor device capable of a signal transmission from a high side to a low side.

A semiconductor device according to the present invention includes a low-side terminal, a high-side terminal, a main output terminal, a low-side switching element, a low-side drive circuit, a high-side switching element, a high-side drive circuit, a detection circuit, a conversion circuit, and a signal transmission circuit. The low-side terminal has a low-side potential. The high-side terminal has a high-side potential different from a low-side potential. The main output terminal has an intermediate potential. The low-side switching element is provided between the main output terminal and the low-side terminal. The low-side drive circuit drives the low-side switching element and operates using the low-side potential as a reference potential and using a supply potential regulated by an offset voltage from the low-side potential as a power source potential. The high-side switching element is provided between the main output terminal and the high-side terminal. The high-side drive circuit drives the high-side switching element and operates using the intermediate potential as a reference potential and using a floating potential regulated by an offset voltage from the intermediate potential as a power source potential. The detection circuit uses the intermediate potential as a reference potential and detects condition information of the high-side switching element, thereby outputting a detection signal. The conversion circuit uses the intermediate potential as a reference potential and outputs a conversion signal corresponding to a detection signal from the detection circuit. The signal transmission circuit outputs a signal corresponding to the conversion signal from the conversion circuit as the voltage signal using the low-side potential as the reference potential. The signal transmission circuit includes a first point, a second point, a signal switching element, and a diode. The intermediate potential is applied to the first point. The referred potential between the low-side potential and the high-side potential, different from the low-side potential and the high-side potential, is applied to the second point. The signal switching element has a first end connected to the first point and a second end, and is switched in accordance with a conversion signal. The diode is provided between the second point and the second end of the signal switching element, and has a direction with which a forward current can flow by a voltage between the first point and the second point in a case where the intermediate potential is the low-side potential.

According to the present invention, the signal transmission circuit includes the diode having the direction with which the forward current can flow by a voltage between the first point and the second point in the case where the intermediate potential is the low-side potential. Thus, the forward voltage is applied to the diode when the intermediate potential is substantially the low-side potential in accordance with a state where the low-side switching element is in the on-state and the high-side switching element is in the off-state. In the above condition, the signal switching element of the signal transmission circuit is switched to control the current flowing in the diode. Thus, the information can be transmitted via the signal transmission circuit by using this current. In the meanwhile, when the intermediate potential is substantially the high-side potential in accordance with a state where the low-side switching element is in the off-state and the high-side switching element is in the on-state, a backward voltage is applied to the diode, thus the signal transmission circuit is in an insulating state. The electrical connection made by the signal transmission circuit between the low side and the high side is thereby blocked. Accordingly, the insulation required between the low side and the high side can be ensured. The insulation in the signal transmission circuit is ensured not by the signal switching element but by the diode. Therefore, a high-voltage switching element is not necessary as the signal switching element. Accordingly, a size of the signal switching element can be reduced. Accordingly, a size of the semiconductor device can be reduced.

These and other objects, features, aspects and advantages of the present invention will become more apparent from the following detailed description of the present invention when taken in conjunction with the accompanying drawings.

BRIEF DESCRIPTION OF THE DRAWINGS

FIG. 7 is a circuit diagram illustrating an example of the intermediate potential detection circuit in FIG. 5.

FIG. 14 is a diagram schematically describing a configuration of a selection circuit included in a semiconductor device according to an embodiment 6 of the present invention.

DESCRIPTION OF THE PREFERRED EMBODIMENTS

Figure 1:
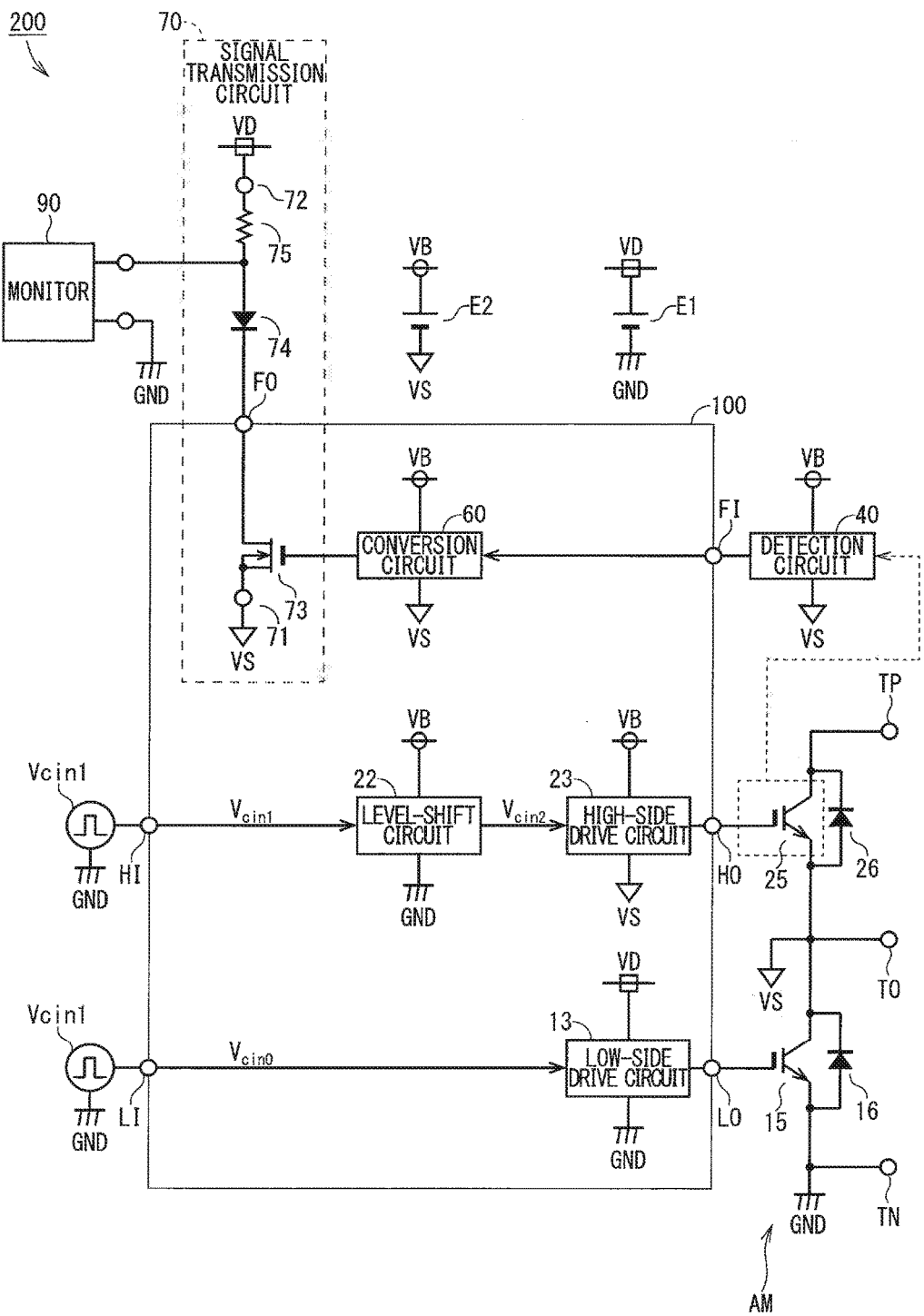
FIG. 1 is a drawing schematically illustrating a configuration of a semiconductor device and a monitor according to an embodiment 1 of the present invention.

Embodiments of the present invention are described based on the drawings hereinafter. The same reference numerals as those described in the drawings hereinafter will be assigned to the same or corresponding element, and a repetitive description is omitted.

Embodiment 1

(Summary of Configuration)

FIG. 1 is a diagram schematically illustrating a configuration of an IPM 200 (semiconductor device) and a monitor 90 according to the embodiment 1 of the present invention. The IPM 200 has a function of an inverter, and includes an HVIC 100 (semiconductor chip), an arm AM driven by the HVIC 100, and a detection circuit 40 detecting condition information of the arm AM. The monitor 90 monitors an information output signal being output from the IPM 200 in accordance with a detection result of the detection circuit 40, and is typically a microcomputer.

The arm AM includes a low-side terminal TN having a low-side potential, a high-side terminal TP having a high-side potential different from the low-side potential, a main output terminal TO having an intermediate potential VS, a low-side IGBT 15 (low-side switching element), and a high-side IGBT 25 (high-side switching element). In the illustrated example, the low-side potential is defined as a ground (GND) potential. The low-side terminal TN is a so-called "N terminal", and the high-side terminal TP is a so-called "P terminal". That is to say, when the low-side potential is considered as a reference potential, the high-side potential is a positive potential. An input voltage (also referred to as "inverter input voltage") applied between the low-side terminal TN and the high-side terminal TP, that is to say, a voltage between the low-side potential and the high-side potential may be several hundreds V or higher, and is approximately 300 V to 600 V, for example. The low-side IGBT 15 is provided between the main output terminal TO and the low-side terminal TN. The high-side IGBT 25 is provided between the main output terminal TO and the high-side terminal TP. Typically, a free wheeling diode 16 and a free wheeling diode 26 are connected to the low-side IGBT 15 and the high-side IGBT 25, respectively.

The HVIC 100 includes a low-side input terminal LI, a high-side input terminal HI, a low-side output terminal LO, the high-side output terminal HO, an information signal input terminal FI, an information signal output terminal FO, a low-side drive circuit 13, a high-side drive circuit 23, and a level-shift circuit 22. The high-side drive circuit 23 and the level-shift circuit 22 are integrated in the HVIC 100. The low-side drive circuit 13 is also integrated in the HVIC 100 in the present embodiment.

A low-side control signal $V_{cin0}$ for controlling the low-side IGBT 15 is input to the low-side input terminal LI. The low-side potential is applied as the reference potential in the low-side control signal $V_{cin0}$. The low-side drive circuit 13 outputs a drive signal for driving the low-side IGBT 15 from the low-side output terminal LO in accordance with the low-side control signal $V_{cin0}$. The low-side IGBT 15 is switched by the drive signal. The low-side drive circuit 13 operates using the low-side potential as the reference potential and using a supply potential VD as a power source potential. The supply potential VD is regulated by an offset voltage E1 from the low-side potential. The offset voltage E1 is a voltage smaller than the inverter input voltage. The offset voltage E1 may be substantially a constant voltage, and is approximately +15 V, for example.

A high-side control signal $V_{cin1}$ for controlling the high-side IGBT 25 is input to the high-side input terminal HI. The low-side potential is applied as the reference potential in the high-side control signal $V_{cin1}$. The level-shift circuit 22 converts the high-side control signal $V_{cin1}$, which uses the low-side potential as the reference potential, into the high-side control signal $V_{cin2}$, which uses the intermediate potential VS as the reference potential. Then, the level-shift circuit 22 transmits the high-side control signal $V_{cin2}$ to the high-side drive circuit 23. The high-side drive circuit 23 outputs a drive signal for driving the high-side IGBT 25 from the high-side output terminal HO in accordance with the high-side control signal $V_{cin2}$. The high-side IGBT 25 is switched by the drive signal. The high-side drive circuit 23 operates using the intermediate potential VS as the reference potential and using a floating potential VD as a power source potential. The floating potential VB is regulated by an offset voltage E2 from the intermediate potential VS. The offset voltage E2 is a voltage smaller than the inverter input voltage. The offset voltage E2 may be substantially a constant voltage, may also be the same as the offset voltage E1, and is approximately +15 V, for example.

The detection circuit 40 detects the condition information of the high-side IGBT 25 to generate the detection signal. The detection signal is output to the information signal input terminal FI of the HVIC 100. The detection circuit 40 uses the intermediate potential VS as the reference potential. The condition information includes at least one type of information. The condition information is typically information of a voltage applied between main terminals of the high-side IGBT 25 (collector-emitter voltage $V_{ce}$) and information of a temperature of the high-side IGBT 25. A specific example of the detection circuit 40 is described hereinafter.

The HVCI 100 further includes a conversion circuit 60. The detection signal is input from the information signal input terminal FI to the conversion circuit 60. The conversion circuit 60 operates using the intermediate potential VS as the reference potential. The conversion circuit 60 outputs a conversion signal corresponding to the detection signal from the detection circuit 40. Specifically, the detection signal which is an analog signal is converted into the conversion signal which is a digital signal. The conversion is typically performed by generating a pulse signal having a pulse width depending on a magnitude of the analog signal. A specific example of the conversion circuit 60 is described hereinafter.

The IPM 200 further includes a signal transmission circuit 70. The signal transmission circuit 70 outputs the information output signal corresponding to the conversion signal from the conversion circuit 60 as the voltage signal using the low-side potential (ground potential) as the reference potential. The monitor 90 monitors the information output signal. The signal transmission circuit 70 includes a first point 71, a second point 72, a signal switching element 73, and a diode 74.

The intermediate potential VS is applied to the first point 71. A referred potential is applied to the second point 72. The referred potential is a potential between the low-side potential and the high-side potential, different from the low-side potential and the high-side potential. As illustrated in the drawings, the referred potential is preferably applied using the supply potential VD.

The signal switching element 73 has a first end connected to the first point 71 and a second end, and is switched in accordance with the conversion signal. In the illustrated example, the signal switching element 73 is an n-channel type MOSFET, and has a source (the first end) connected to the first point 71, a drain (the second end), and a gate, thereby being switched in accordance with the conversion signal applied to the gate. The signal switching element 73 is preferably integrated in the HVIC 100. In the above case, a size of the HVIC 100 can be reduced as a size of the signal switching element 73 reduces. It is preferable that a withstand voltage of the signal switching element 73 is not unnecessarily high to reduce the size. The withstand voltage of the signal switching element 73 may be smaller than a withstand voltage of the diode 74. The withstand voltage of the signal switching element 73 may be smaller than the inverter input voltage.

The diode 74 is provided between the second point 72 and the second end of the signal switching element 73. The diode 74 has a direction with which a forward current can flow by the voltage between the first point 71 and the second point 72 in a case where the intermediate potential VS is the low-side potential. It is preferable that the diode 74 is not integrated in the HVIC 100 but is externally attached to the HVIC 100. The withstand voltage of the diode 74 is higher than the inverter input voltage. Thus, a so-called high-voltage diode is used as the diode 74. For example, when the inverter input voltage has specifications of 300 V or larger, the diode having the withstand voltage of 300 V or larger is used.

Potential between the diode 74 and the second point 72, specifically between the diode 74 and a resistance element 75 is output from the signal transmission circuit 70 as the information output signal. The reference potential of the information output signal is the low-side potential (ground potential). The monitor 90 monitors the information output signal. The monitor 90 may be a microcomputer having a function of generating a control signal to the HVIC 100. In the above case, the IPM 200 can be controlled in accordance with the information output signal. For example, when the information output signal is some error signal on the IPM 200, the microcomputer can make the IPM 200 execute a protection operation such as a blocking operation of the low-side IGBT 15.

(Operation of Signal Transmission Circuit 70)

In a period during which the low-side IGBT 15 is in the on-state, the signal transmission circuit 70 transmits to the monitor 90 the information output signal corresponding to the conversion signal from the conversion circuit 60. The above configuration is described hereinafter. When the low-side IGBT 15 is turned on, the intermediate potential VS is switched substantially to a low-side potential (ground potential). Accordingly, a forward voltage is applied to the diode 74. Thus, current flows between the first point 71 and the second point 72 in response to the switching of the signal switching element 73. The potential being output to the monitor 90 varies in response to the current. Thus, when the switching of the signal switching element 73 is performed by the conversion signal from the conversion circuit 60, the signal transmission circuit 70 can transmit to the monitor 90 the information output signal corresponding to the conversion signal.

In the meanwhile, in a period during which the high-side IGBT 25 is in the on-state, the signal transmission circuit 70 electrically insulates the conversion circuit 60 from the monitor 90. When the high-side IGBT 25 is turned on, the intermediate potential VS is switched substantially to a high-side potential. Accordingly, a backward voltage is applied to the diode 74. Thus, current does not flow between the first point 71 and the second point 72 regardless of the switching state of the signal switching element 73. That is to say, the conversion circuit 60 and the monitor 90 are insulated from each other. In a period during which the intermediate potential VS is substantially a high-side potential, a large voltage substantially equal to the inverter input voltage is applied between the conversion circuit 60 and the monitor 90. Thus, the electrical insulation between the conversion circuit 60 and the monitor 90 needs to be ensured. The electrical insulation described above is ensured by the diode 74 withstanding the application of the backward voltage.

(Detail of Configuration)

Figure 2:
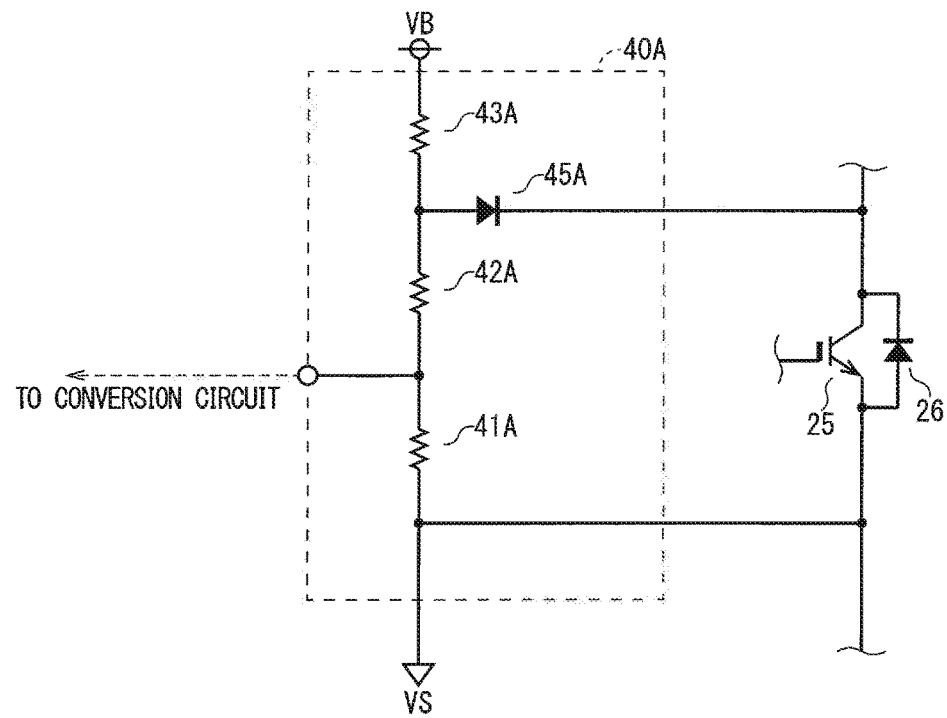
FIG. 2 is a circuit diagram for describing a first example of a detection circuit in FIG. 1.

FIG. 2 is a circuit diagram for describing a detection circuit 40A which is an example of a detection circuit 40 (FIG. 1) in a case where the condition information described above is the information of the voltage applied to the high-side IGBT 25. The high-side IGBT 25 includes an emitter terminal (a first terminal), a collector terminal (a second terminal), and a gate terminal (a third terminal), and controls an electrical connection between the emitter terminal and the collector terminal in accordance with the voltage applied to the gate terminal. The detection circuit 40A detects the voltage $V_{ce}$ applied between the emitter terminal and the collector terminal as the condition information. Specifically, the detection circuit 40A includes a resistance element 41A, a resistance element 42A, a resistance element 43A, and a diode 45A. The resistance element 41A, the resistance element 42A, and the resistance element 43A are serially connected in sequence to join a point where the intermediate potential VS is applied and a point where the floating potential VB is applied. The emitter terminal is connected between the point where the intermediate potential VS is applied and the resistance element 41A. The collector terminal is connected between the resistance element 42A and the resistance element 43A via the diode 45A. A direction of the diode 45A is selected so that a flow of current is blocked when the high-side IGBT is in an off-state. The detection signal having the potential between the resistance element 41A and the resistance element 42A is output to the information signal input terminal FI.

Figure 3:
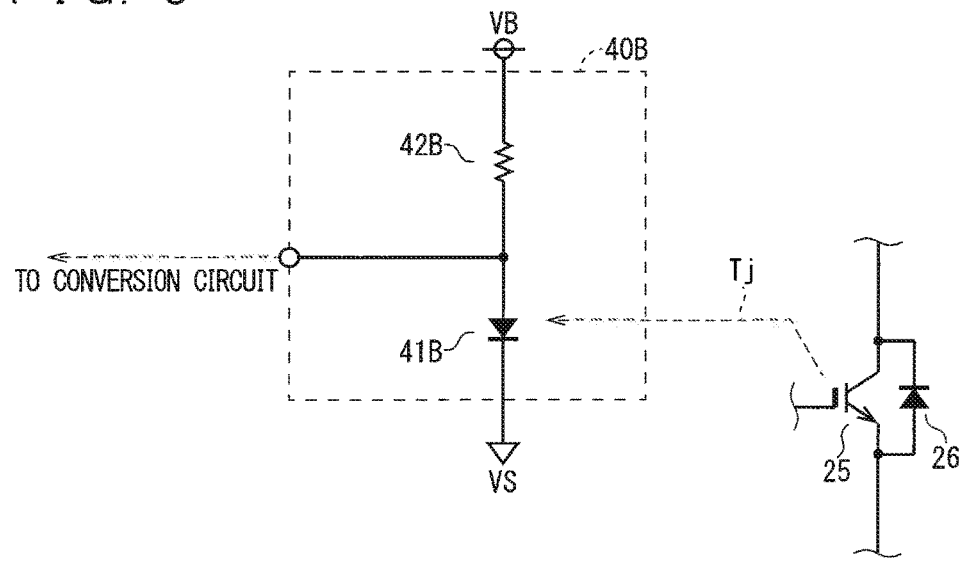
FIG. 3 is a circuit diagram for describing a second example of a detection circuit in FIG. 1.

FIG. 3 is a circuit diagram for describing a detection circuit 40B which is an example of the detection circuit 40 (FIG. 1) in a case where the condition information described above is the information of the temperature of the high-side IGBT 25. Specifically, the detection circuit 40B has a diode 41B as a temperature sensor and a resistance element 42B. The diode 41B is located in a position susceptible to heat from the high-side IGBT 25, thus the diode 41B as the temperature sensor can detect a junction temperature Tj of the high-side IGBT 25. "The junction temperature" herein indicates a temperature at a pn junction in the semiconductor switching element. The diode 41B and the high-side IGBT 25 are preferably formed on a common semiconductor substrate so that a temperature is measured accurately. In the above case, it is necessary that the reference potential of the detection circuit 40 having the diode 41B is not the low-side potential but the high-side potential to secure reliability. The diode 41B and the resistance element 42B are serially connected in sequence to join the point where the intermediate potential VS is applied and the point where the floating potential VB is applied. A direction of the diode 41B is selected so that a forward voltage is applied to the diode 41B. The detection signal having the potential between the diode 41B and the resistance element 42B is output to the information signal input terminal FI.

Figure 4:
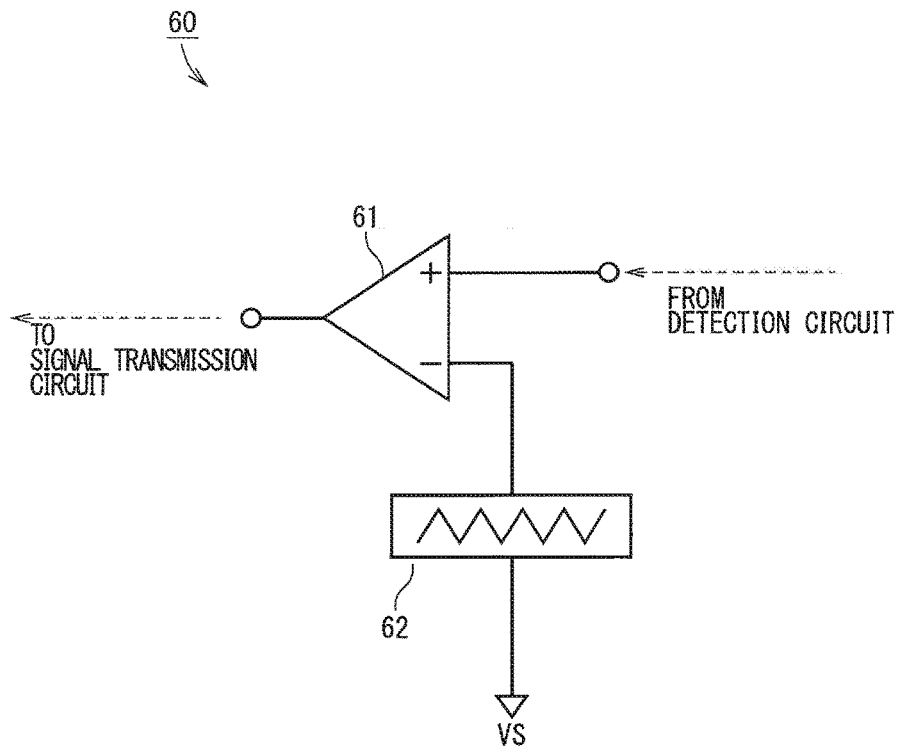
FIG. 4 is a circuit diagram for describing an example of a conversion circuit in FIG. 1.

FIG. 4 is a circuit diagram for describing an example of the conversion circuit 60 in FIG. 1. A value of the detection signal from the detection circuit 40 (FIG. 1) and a potential of a triangle wave generated by a triangle wave generator 62 using the intermediate potential VS as the reference potential are compared by a comparator 61. The comparator 61 thereby generates a conversion signal having a pulse width in accordance with the value of the detection signal. The conversion signal is transmitted to the gate of the signal switching element 73 of the signal transmission circuit 70 (FIG. 1).

(Effect)

According to the present embodiment, the signal transmission circuit 70 (FIG. 1) includes the diode 74 having the direction with which the forward current can flow by the voltage between the first point 71 and the second point 72 in the case where the intermediate potential VS is the low-side potential. Thus, the forward voltage is applied to the diode 74 when the intermediate potential VS is set substantially to the low-side potential in accordance with a state where the low-side IGBT 15 is in the on-state and the high-side IGBT 25 is in the off-state. In the above condition, the signal switching element 73 of the signal transmission circuit 70 is switched to control the current flowing in the diode 74. Thus, the information can be transmitted via the signal transmission circuit 70 by using this current. In the meanwhile, when the intermediate potential VS is set substantially to the high-side potential in accordance with a state where the low-side IGBT 15 is in the off-state and the high-side IGBT 25 is in the on-state, the backward voltage is applied to the diode 74, thus the signal transmission circuit 70 enters an insulating state. The electrical connection made by the signal transmission circuit 70 between the monitor 90 (low side) and the conversion circuit 60 (high side) is thereby blocked. Accordingly, the insulation required between the low side and the high side can be ensured. The insulation in the signal transmission circuit 70 is ensured not by the signal switching element 73 but by the diode 74. Therefore, a high-voltage switching element is not necessary as the signal switching element 73. Thus, the size of the signal switching element 73 can be reduced. Accordingly, the size of the IPM 200 can be reduced, and particularly, the size of the HVIC 100 can be significantly reduced.

When a level-shift circuit having a downshift function is integrated in the HVIC instead of the signal transmission circuit 70, the size of the HVIC significantly increases. Specifically, the level-shift circuit normally includes a high-voltage semiconductor switching element which occupies a large area in the HVIC. Moreover, it is practically difficult to integrate the level-shift circuit having the downshift function in the HVIC in consideration of the reliability.

The referred potential which is the potential applied to the second point 72 may be applied using the supply potential VD. The configuration of the IPM 200 is thereby simplified.

The condition information of the high-side IGBT 25 may include the information of the collector-emitter voltage $V_{ce}$ of the high-side IGBT 25. In the above case, an occurrence of abnormality in the collector-emitter voltage $V_{ce}$ of the IGBT 25 provided in the high side can be transmitted to the low side.

The condition information of the high-side IGBT 25 may include the information of the temperature of the high-side IGBT 25. In the above case, an occurrence of temperature abnormality in the high-side IGBT 25 can be transmitted to the low side.

The high-side drive circuit 23 and the level-shift circuit 22 may be integrated in one semiconductor chip 100. In the above case, the size of the IPM 200 can be reduced.

The diode 74 of the signal transmission circuit 70 may be externally attached to the semiconductor chip 100. In the above case, the diode 74, which is the high-voltage element, needs not be provided in the semiconductor chip 100. Accordingly, the size of the semiconductor chip 100 can be reduced.

The signal switching element 73 in the signal transmission circuit 70 may be integrated in the semiconductor chip 100. Accordingly, the size of the IPM 200 can be reduced.

Modification Example

The one arm AM is described in the above embodiment, however, a total number of arms is not limited. When a plurality of configurations, each of which is similar to the IMP 200, are provided, an IPM having a plurality of arms AM can be formed. Particularly, when the IPM having the three arms AM is formed, a function as a three-phase inverter can be obtained. In the above case, the three main output terminals corresponding to the main output terminal TO have a function as a three-phase alternate current output terminal.

In the embodiment described above, the low-side terminal TN is a so-called "N terminal" and the high-side terminal TP is a so-called "P terminal"; however, this relationship may be reversed. Specifically, the low-side terminal TN may be the so-called "P terminal" and the high-side terminal TP may be the so-called "N terminal". That is to say, when the low-side potential is considered as the reference potential, the high-side potential may be a negative potential.

In the embodiment described above, an IGBT is used as each of the low-side switching element and the high-side switching element, however, a power semiconductor switching element other than an IGBT may also be used. For example, a metal insulator semiconductor field effect transistor (MISFET) such as the MOSFET may also be used.

In the embodiment described above, an n-channel type MOSFET is used as the signal switching element 73, however, a p-channel type MOSFET may also be used alternatively. A MISFET other than a MOSFET may also be used. A semiconductor switching element other than a MISFET may also be used, thus a bipolar transistor may also be used, for example.

In the embodiment described above, a diode is used as the temperature sensor in the case where the detection circuit 40 detects the temperature; however, an element other than a diode may also be used as the temperature sensor. For example, a thermistor element may also be used.

Embodiment 2

(Configuration)

Figure 5:
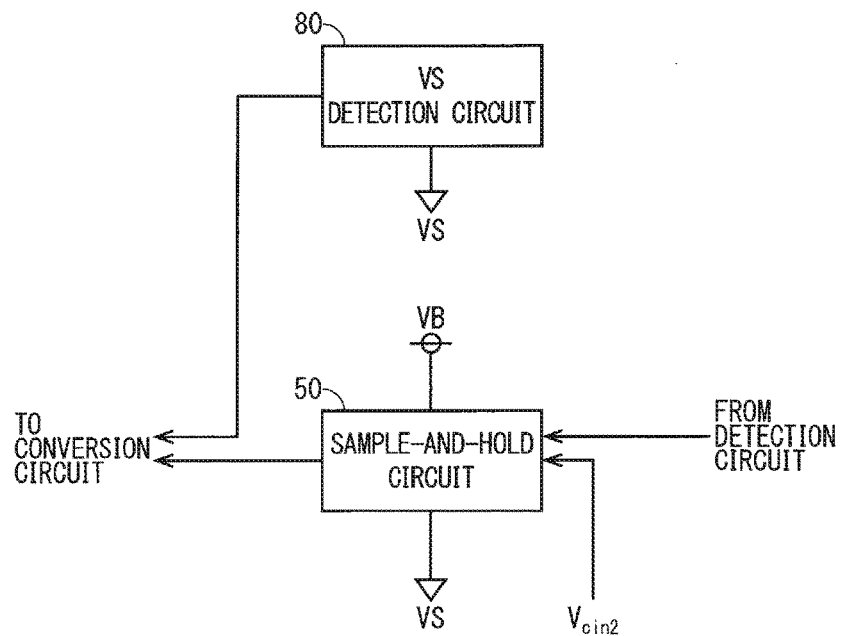
FIG. 5 is a drawing schematically illustrating a configuration of an intermediate potential detection circuit and a sample and hold circuit included in a semiconductor device according to an embodiment 2 of the present invention.

With reference to FIG. 5, the IPM according to the present embodiment has a sample and hold circuit 50 and a VS detection circuit 80 (intermediate potential detection circuit) in addition to the configuration of the IPM 200 (FIG. 1: the embodiment 1).

The sample and hold circuit 50 is provided between the detection circuit 40 and the conversion circuit 60. The sample and hold circuit 50 starts a sample operation at a timing when the high-side IGBT 25 is turned on, and starts a hold operation at a timing when the high-side IGBT 25 is turned off. The timings of turning-on and turning-off the high-side IGBT 25 are recognized when the high-side control signal $V_{cin2}$ from the level-shift circuit 22 is referenced. In other words, the sample and hold circuit 50 executes the sample and hold operation using the high-side control signal $V_{cin2}$ as a trigger.

The VS detection circuit 80 detects whether the intermediate potential VS is in a low-state being closer to the low-side potential out of the low-side potential and the high-side potential or in a high-state being closer to the high-side potential out of the low-side potential and the high-side potential. The conversion circuit 60 starts outputting the conversion signal using, as a trigger, detection by the VS detection circuit 80 of the transition from the high-state to the low-state.

Figure 6:
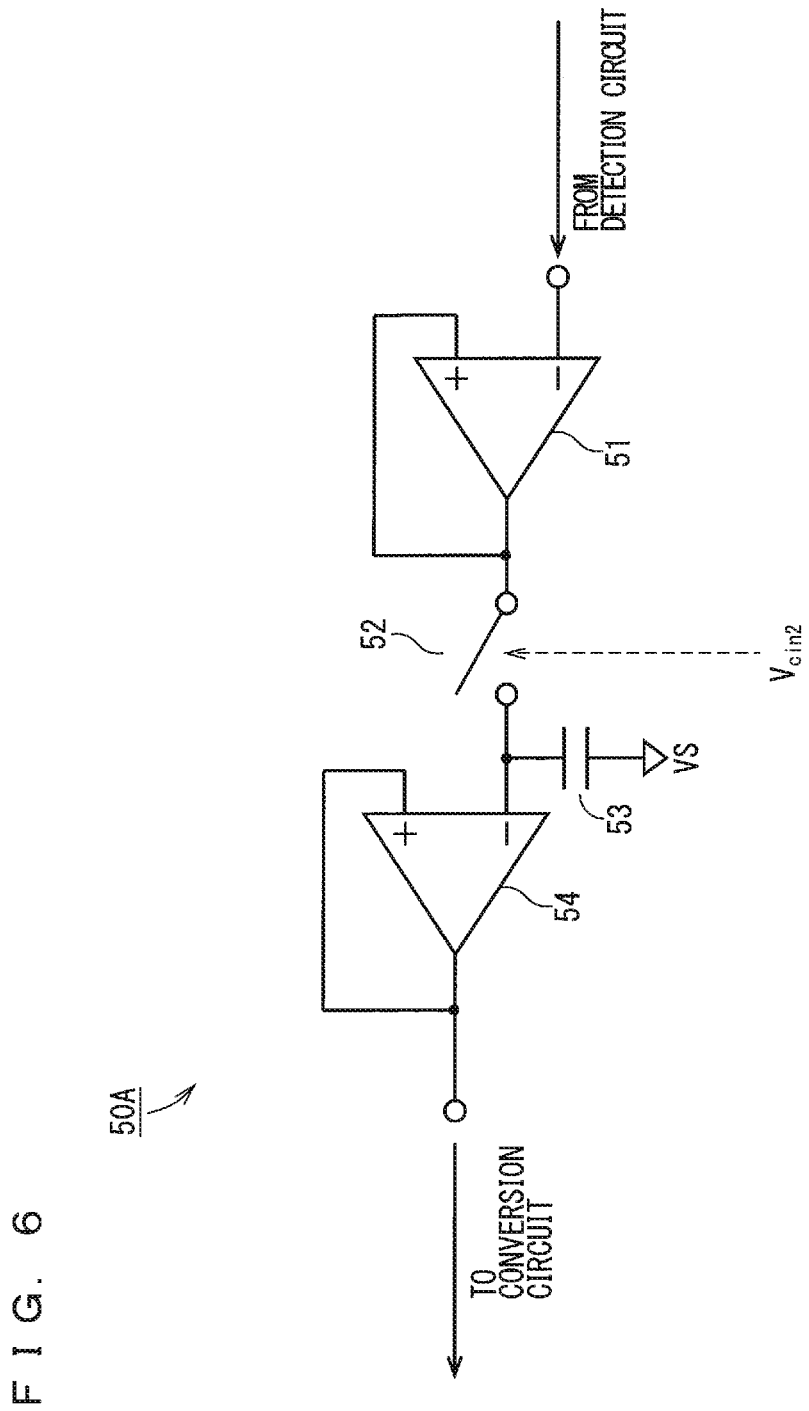
FIG. 6 is a circuit diagram illustrating an example of the sample and hold circuit in FIG. 5.

FIG. 6 is a circuit diagram illustrating a sample and hold circuit 50A as an example of the sample and hold circuit 50 (FIG. 5). The sample and hold circuit 50A includes an operational amplifier 51, a switch 52, a capacitor 53, and an operational amplifier 54. The detection signal from the detection circuit 40 is input to an inverting input terminal of the operational amplifier 51. An output terminal of the operational amplifier 51 is connected to a non-inverting input terminal of the operational amplifier 51 itself. The switch 52 connects the output terminal of the operational amplifier 51 and the inverting input terminal of the operational amplifier 54. A first end of the capacitor 53 is connected to the inverting input terminal of the operational amplifier 54. The intermediate potential VS as the reference potential is applied to a second end of the capacitor 53. The switch 52 is in an on-state when the high-side control signal $V_{cin2}$ corresponds to the turning-on, and is in an off-state when the high-side control signal $V_{cin2}$ corresponds to the turning-off. The sample and hold circuit 50A is preferably integrated in the HVIC 100.

FIG. 7 is a circuit diagram illustrating a VS detection circuit 80A as an example of the VS detection circuit 80 (FIG. 5). The VS detection circuit 80A includes a resistance element 81A, a resistance element 82A, a referred-voltage source 83A, and a comparator 84A. The resistance element 81A and the resistance element 82A are serially connected in sequence to join a point of the low-side potential and a point of the floating potential VB. Thereby obtained is a potential generated when a voltage between the low-side potential (ground potential) and the floating potential VB is divided between the resistance element 81A and the resistance element 82A. By the comparator 84A, the obtained potential is compared with a potential lower by the voltage of the referred-voltage source 83A, using the floating potential VB as a reference. A sign of this voltage is set to be the same as that of the high-side potential. A magnitude of this voltage is set to be sufficiently smaller than a value of the divided voltage described above in the case where the intermediate potential VS is the high-side potential. Accordingly, the comparator 84A generates a high signal when the intermediate potential VS is the low-side potential, and generates a low signal when the intermediate potential VS is shifted from the low-side potential toward the high-side potential. The VS detection circuit 80A is preferably integrated in the HVIC 100.

An operation of the circuit illustrated in FIG. 7 is described herein. The intermediate potential VS varies from the low-side potential to the high-side potential as described above. The floating potential VB is higher than the intermediate potential VS by the offset voltage E2 (VB=VS+E2). Vr indicates a voltage of the referred-voltage source 83A, and r1 and r2 indicate resistance values of the resistance element 82A and the resistance element 81A, respectively. V+ and V− indicate each potential of a "+" input terminal and a "−" input terminal of the comparator 84A, respectively. The comparator 84A compares V+ with V−, and outputs "high" in a case of V+>V−. Herein, V+=VB·r2/(r1+r2) and V−=VB−Vr are satisfied, thus VB−r2/(r1+r2)>VB−Vr is satisfied in the case of V+>V−. The above expression is simplified as VB<(1+r2/r1)·Vr. Herein, VB=VS+E2 is satisfied as described above, thus the following inequality is obtained.

$$VS<(1+r2/r1)\cdot Vr-E2$$

When the intermediate potential VS satisfies the inequality described above, the comparator 84A outputs "high". When r2, r1, and E2 are appropriately set, thus the state where the intermediate potential VS is around the low-side potential can be detected. For example, assumed is that the intermediate potential VS varies between 0V and 600V when the low-side potential and the high-side potential are 0V and 600V, respectively. E2, Vr, r1, and r2 are set as follows: E2=15V, Vr=0.32V, r1=10 kΩ, and r2=490 kΩ. In the above case, the inequality described above is expressed as VS<(1+490×10³/10×10³)·0.32−15=50·0.32−15=1[V]. That is to say, when the intermediate potential VS is smaller than 1V, the comparator 84A outputs "high". Even when the intermediate potential VS is 600V, only the voltage of 12.3V at the highest is applied to the both ends of the resistance element 82A.

The other configuration is substantially the same as that of the IPM 200 according to the embodiment 1 described above, thus the description is not repeated.

(Operation of IPM)

Figure 8:
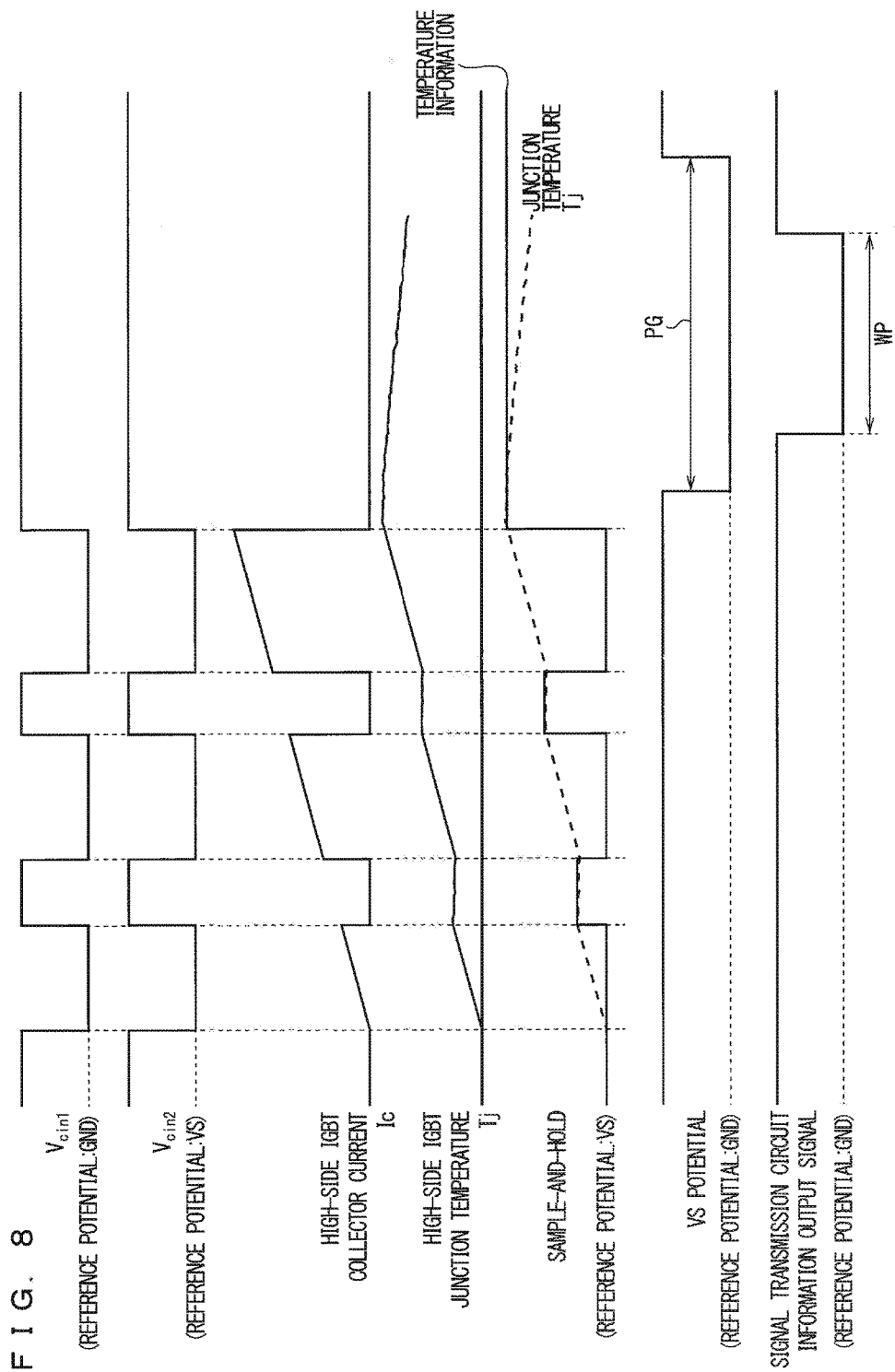
FIG. 8 is a timing chart diagram schematically illustrating an operation of the semiconductor device according to the embodiment 2 of the present invention.

FIG. 8 is a timing chart diagram schematically illustrating the operation of the IPM according to the embodiment of the present invention. FIG. 8 illustrates a case of applying a low-active system described hereinafter as an example, and in a case of a high-active system, each waveform of the high-side control signal $V_{cin1}$ and the high-side control signal $V_{cin2}$ is reversed.

In the case of the low-active system, the high-side IGBT 25 is in the on-state when the high-side control signal $V_{cin1}$ and the high-side control signal $V_{cin2}$ are in the low-state, and the high-side IGBT 25 is in the off-state when the high-side control signal $V_{cin1}$ and the high-side control signal $V_{cin2}$ are in the high-state. In a case where an L load (induction load) is connected to the IPM, focusing on one pulse period in which $V_{cin2}$ is in the low-state, that is to say, one pulse period in which the high-side IGBT 25 is in the on-state, a collector current $I_c$ gradually increases in the one period and reaches a maximum immediately before the high-side IGBT 25 is turned off. In accordance with the above state, the junction temperature Tj gradually increases in the one period, and reaches a maximum immediately before the high-side IGBT 25 is turned off. After the turning-off, the junction temperature Tj gradually decreases. According to the present embodiment, when the sample and hold circuit 50 is provided, a value of the junction temperature Tj sampled immediately before the turning-off is held.

The conversion circuit 60 starts outputting the conversion signal corresponding to the held value using, as a trigger, a transition of the intermediate potential VS to the low-side potential (ground potential). In a period PG during which the intermediate potential VS is the low-side potential, the signal transmission circuit 70 can transmit the signal. Accordingly, the information output signal having the pulse width WP corresponding to the held value is transmitted in the period PG.

(Effect)

According to the present embodiment, the sample and hold circuit 50 starts the sample operation at the timing when the high-side IGBT 25 is turned on, and starts the hold operation at the timing when the high-side IGBT 25 is turned off. The conversion circuit 60 can output the condition information detected immediately before the high-side IGBT 25 is turned off by using the signal from the sample and hold circuit 50.

Particularly, the junction temperature Tj tends to take the maximum value immediately before the turning-off. The collector-emitter voltage $V_{ce}$ nearly corresponds to the collector current Ic in FIG. 8, and tends to take a maximum value immediately before the turning-off. Accordingly, when the sample and hold circuit 50 is provided, those maximum values can be transmitted to the monitor 90.

The conversion circuit 60 starts outputting the conversion signal using, as the trigger, detection by the VS detection circuit 80 of the transition from the high-state to the low-state. Accordingly, suppressed is the conversion circuit 60 unnecessarily outputting the conversion signal. Particularly, the conversion signal being output over the timing when the intermediate potential VS drops to the low-side potential is only partially received by the monitor 90, and may be recognized as an incorrect information.

Modification Example

The VS detection circuit 80 may be provided without the sample and hold circuit 50. Even in the above case, the unnecessary output of the conversion signal is suppressed.

The sample and hold circuit 50 may be provided without the VS detection circuit 80. Even in the above case, the conversion circuit 60 can output the condition information detected immediately before the high-side IGBT 25 is turned off.

Embodiment 3

(Configuration)

Figure 9:
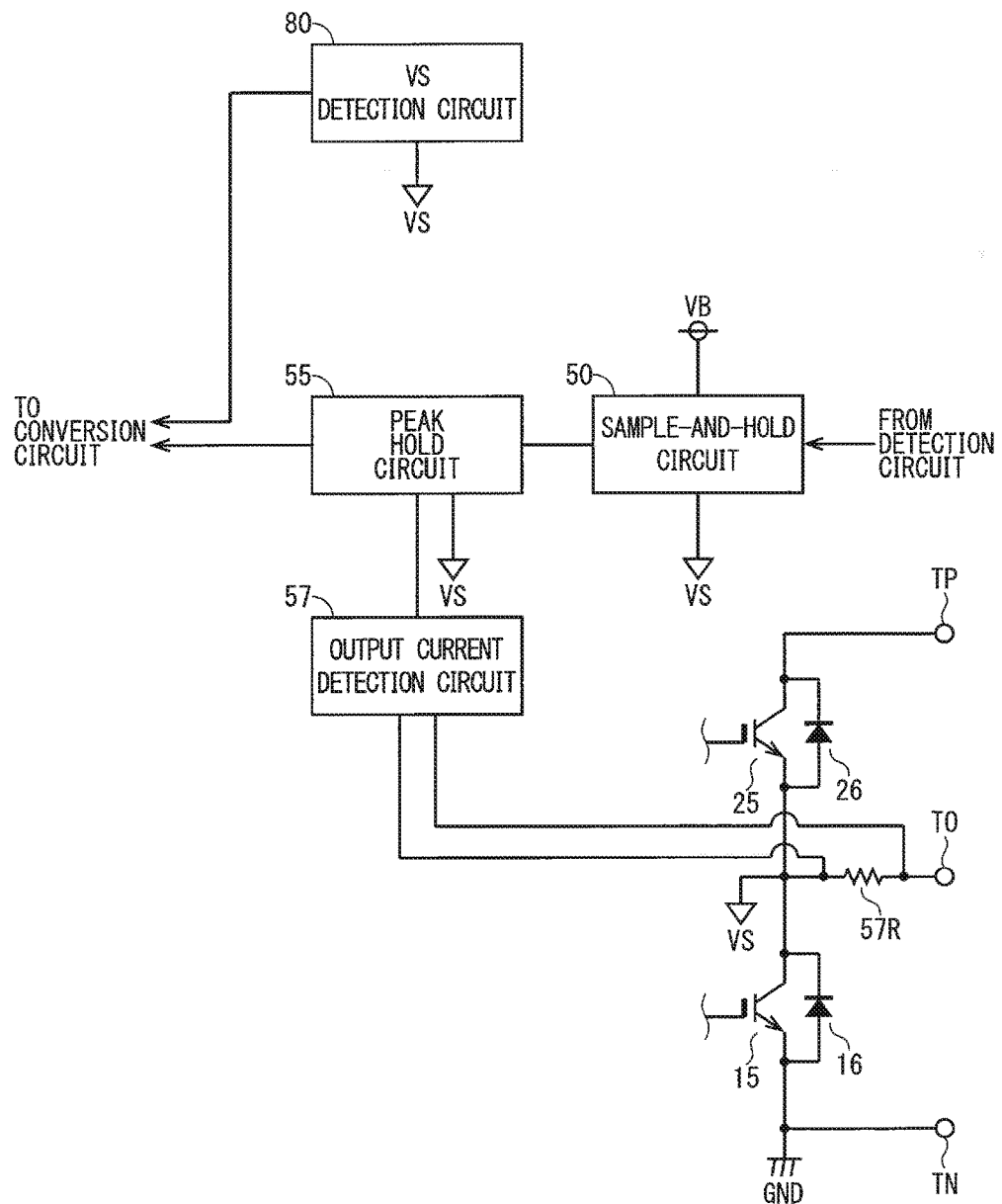
FIG. 9 is a drawing schematically describing a configuration of an intermediate potential detection circuit, a sample and hold circuit, a peak hold circuit, and an output current detection circuit included in a semiconductor device according to an embodiment 3 of the present invention.

With reference to FIG. 9, the IPM according to the present embodiment further includes an output current detection circuit 57 and a peak hold circuit 55 in addition to the configuration of the IPM according to the embodiment 2. The peak hold circuit 55 is preferably integrated in the HVIC 100 (FIG. 1).

The output current detection circuit 57 detects presence of an output current from the main output terminal TO. The peak hold circuit 55 is provided between the detection circuit 40 and the conversion circuit 60, and performs a peak hold operation when the output current detection circuit 57 detects the presence of the output current. The detection of the presence of the output current using the output current detection circuit 57 is performed by detecting a voltage drop in a shunt resistance element 57R provided in the main output terminal TO to detect the current.

Figure 10:
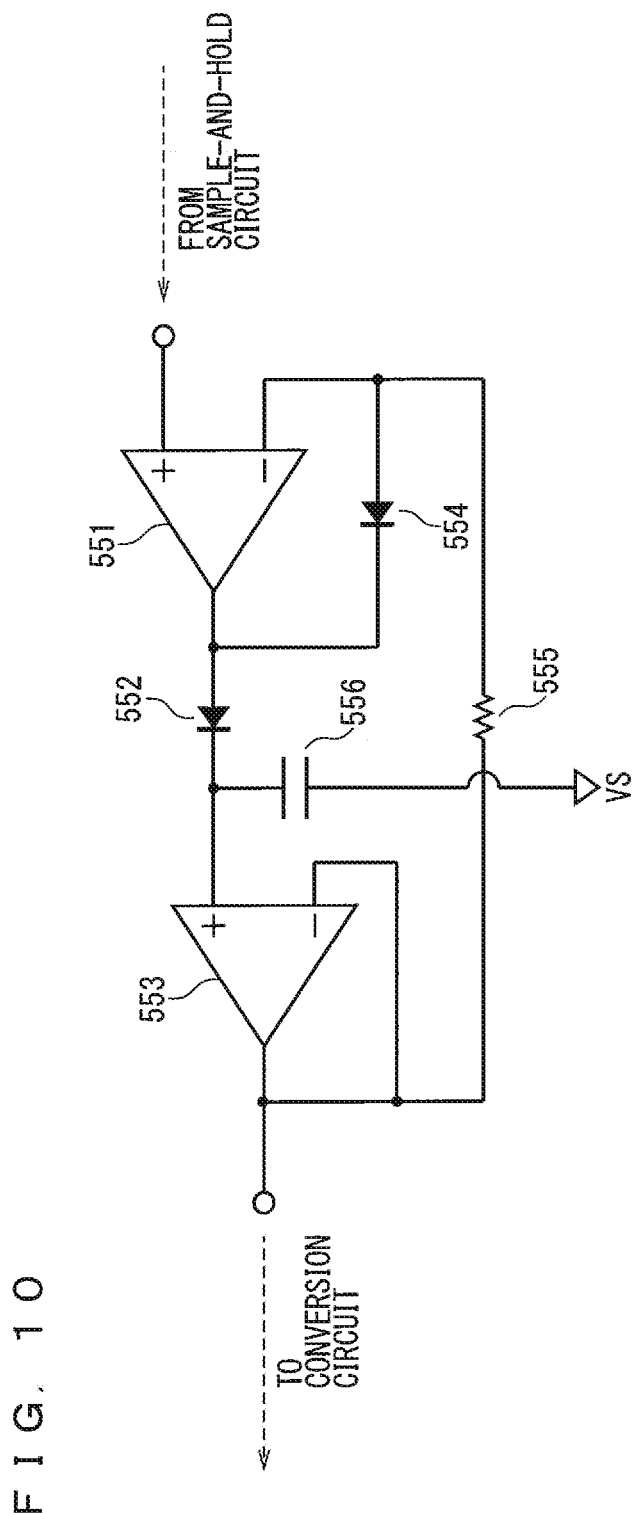
FIG. 10 is a circuit diagram illustrating an example of the peak hold circuit in FIG. 9.

FIG. 10 is a circuit diagram illustrating an example of the peak hold circuit 55 in FIG. 9. In the present example, the peak hold circuit 55 includes an operational amplifier 551, a diode 552, an operational amplifier 553, a diode 554, and a resistance element 555. The detection circuit 40 (FIG. 1) is connected to a non-inverting input terminal of the operational amplifier 551 via the sample and hold circuit 50 (FIG. 9). The non-inverting input terminal of the operational amplifier 551 is connected to an output terminal of the operational amplifier 551 via the diode 554. The output terminal of the operational amplifier 551 is connected to the non-inverting input terminal of the operational amplifier 553 via the diode 552. The inverting input terminal and the output terminal of the operational amplifier 553 are connected to each other. The output terminal of the operational amplifier 553 is connected to the inverting input terminal of the operational amplifier 551 via the resistance element 555. A first end of the capacitor 556 is connected to the non-inverting input terminal of the operational amplifier 553. The intermediate potential VS as the reference potential is applied to a second end of the capacitor 556. The output terminal of the operational amplifier 553 is connected to the conversion circuit 60 (FIG. 1).

The other configuration is substantially the same as that of the IPM 200 according to the embodiment 2 described above, thus the description is not repeated.

(Operation)

Figure 11:
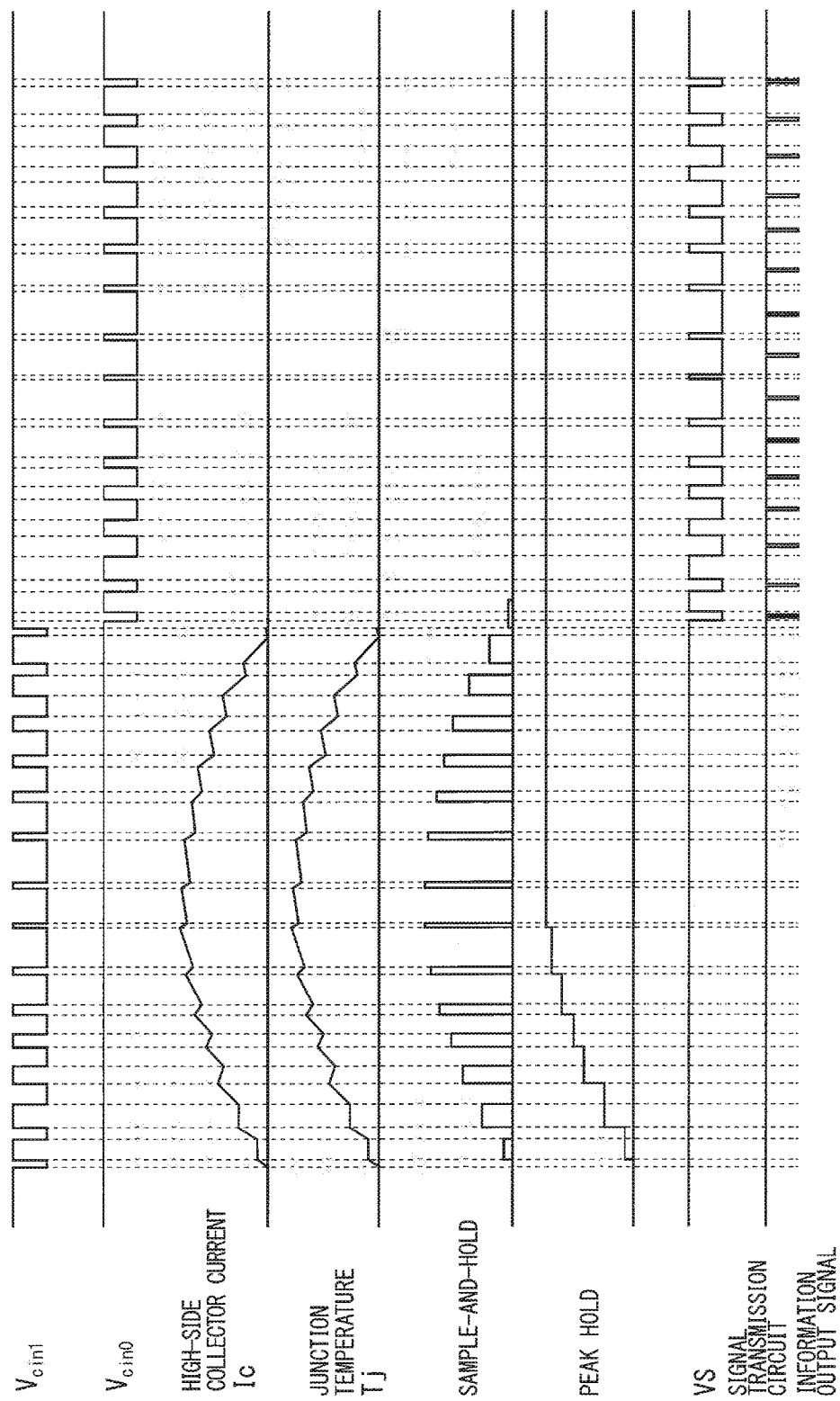
FIG. 11 is a timing chart diagram schematically illustrating an example of an operation of the semiconductor device according to the embodiment 3 of the present invention.

FIG. 11 is a timing chart diagram schematically illustrating the operation of the IPM according to the present embodiment. The present example describes a case where the IPM outputs a sine-wave three-phase alternate current. In the present example, the pulse width of the high-side control signal $V_{cin1}$ is controlled, thus the waveform of the collector current Ic of the high-side IGBT 25 (FIG. 1) is defined as a half cycle of the sine wave. The junction temperature Tj of the high-side IGBT 25 takes a maximum value halfway through the half cycle. When the peak hold circuit 55 is used, the information of the maximum value is output from the signal transmission circuit 70 in a period during which the intermediate potential VS is the low-side potential after the half cycle described above.

(Effect)

According to the present embodiment, the peak hold operation is performed in a period during which the presence of the output current from the main output terminal TO is detected. Accordingly, the conversion circuit 60 can output the peak information in one period during which the output current occurs.

Modification Example

At least one of the VS detection circuit 80 and the sample and hold circuit 50 may be omitted. Even in the above case, the peak information in one period during which the output current occurs can be output by using the conversion circuit 55.

Embodiment 4

(Configuration)

Figure 12:
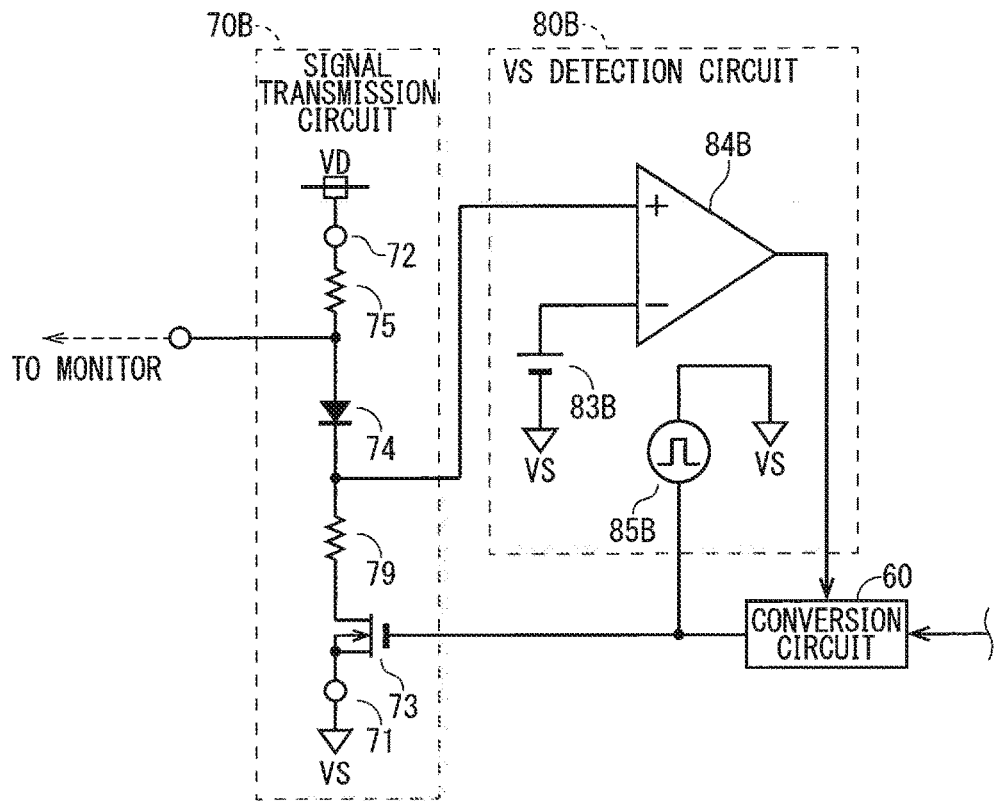
FIG. 12 is a circuit diagram schematically describing a configuration of an intermediate potential detection circuit and a signal transmission circuit included in a semiconductor device according to an embodiment 4 of the present invention.

With reference to FIG. 12, in the present embodiment, a VS detection circuit 80B (intermediate potential detection circuit) is used as one type of the VS detection circuit 80 (FIG. 5). A signal transmission circuit 70B is used instead of the signal transmission circuit 70 (FIG. 1).

The signal transmission circuit 70B includes a transmission resistance element 79 between the signal switching element 73 and the diode 74. The transmission resistance element 79 is preferably integrated in the HVIC 100 (FIG. 1). The signal transmission circuit 70B has the configuration similar to the signal transmission circuit 70 except for the above configuration.

The VS detection circuit 80B includes a referred-voltage source 83B, a comparator 84B, and a dummy pulse generation source 85B. The comparator 84B is connected between the diode 74 and the transmission resistance element 79. The comparator 84B compares potential in this connection point and potential in which a voltage of the referred-voltage source 83B is added to the low-side potential as the reference. A sign of this voltage is set to be the same as that of the high-side potential. A magnitude of this voltage is set to be smaller than a value of the voltage drop in the transmission resistance element 79 when a current flows in the signal transmission circuit 70B. Accordingly, an output signal of the comparator 84B is a high signal when a current flows in the signal transmission circuit 70B, and is a low signal when a current does not flow in the signal transmission circuit 70B. The dummy pulse generation source 85B generates a dummy pulse for making the signal switching element 73 entering the on-state. The VS detection circuit 80B is preferably integrated in the HVIC 100.

(Operation of VS Detection Circuit 80B)

The dummy pulse generation source 85B generates the dummy pulse to make the signal switching element 73 temporarily entering the on-state. At this time, when the intermediate potential VS is the low-side potential, forward voltage is applied to the diode 74, thus current flows in the transmission resistance element 79. A voltage drop therefore occurs in the transmission resistance element 79. Thus, the potential being input from the signal transmission circuit 70B to the comparator 84B is a potential shifted toward the high-side potential by the voltage drop with reference to the intermediate potential VS. The comparator 84B therefore outputs to the conversion circuit 60 the high signal, which indicates that the intermediate potential VS is the low-side potential. On the contrary, when the intermediate potential VS is the high-side potential, backward voltage is applied to the diode 74, thus current does not flow in the transmission resistance element 79. The voltage drop does not therefore occur in the transmission resistance element 79. Thus, the potential being input from the signal transmission circuit 70B to the comparator 84B remains the intermediate potential VS. The comparator 84B therefore outputs the low signal, which indicates that the intermediate potential VS is the high-side potential to the conversion circuit 60. The intermediate potential VS is detected by the operation described above, and the result is output to the conversion circuit 60.

(Effect)

According to the present embodiment, the VS detection circuit 80B is connected between the diode 74 and the transmission resistance element 79. Accordingly, the configuration of the VS detection circuit 80 can be simplified.

Embodiment 5

Figure 13:
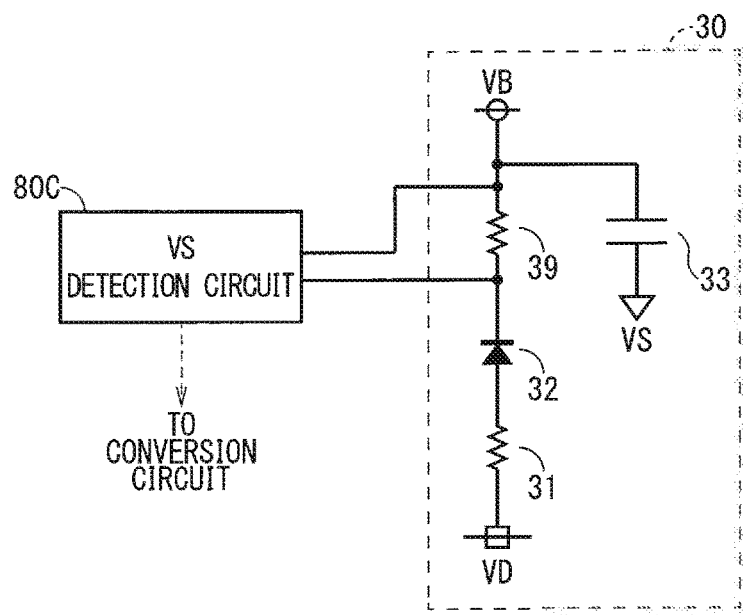
FIG. 13 is a diagram schematically describing a configuration of a bootstrap circuit and an intermediate potential detection circuit included in a semiconductor device according to an embodiment 5 of the present invention.

With reference to FIG. 13, the IPM according to the present embodiment includes a bootstrap circuit 30 which generates the floating potential VB using the supply potential VD and the intermediate potential VS. The bootstrap circuit 30 is preferably integrated in the HVIC 100 (FIG. 1). The bootstrap circuit 30 includes a resistance element 31, a diode 32, a capacitor 33, and a resistance element 39. A first end of the capacitor 33 is connected to a point of the intermediate potential VS, and the floating potential VB is output from a second end of the capacitor 33. A charging path made by the resistance element 31 and the diode 32 which are serially connected from a point of the supply potential VD is connected to the second end. The resistance element 39 is inserted into the charging path. Current flows in the charging path during a charging operation of the bootstrap circuit 30. A voltage drop therefore occurs in the resistance element 39.

In the present embodiment, a VS detection circuit 80C (intermediate potential detection circuit) is provided as one type of the VS detection circuit 80 (FIG. 5). The VS detection circuit 80C detects the voltage drop described above to detect whether or not the bootstrap circuit 30 is performing a charging operation. The bootstrap circuit 30 performs a charging operation when the intermediate potential VS applied to the first end of the capacitor 33 drops to the low-side potential (ground potential). The VS detection circuit 80C can therefore detect the intermediate potential VS by detecting whether or not the bootstrap circuit 30 is performing a charging operation.

According to the present embodiment, the VS detection circuit 80C detects the intermediate potential VS by detecting whether or not the bootstrap circuit 30 is performing a charging operation. Accordingly, the configuration of the VS detection circuit 80C can be simplified.

Embodiment 6

(Configuration)

With reference to FIG. 14, in the IPM according to the present embodiment, condition information of the low-side IGBT 15 (FIG. 1), corresponding to the condition information of the high-side IGBT 25 (FIG. 1), is detected. For example, information of the junction temperature is detected for each of the high-side IGBT 25 and the low-side IGBT 15.

The IPM according to the present embodiment includes a selection circuit 95 in addition to the configuration of the IPM according to each embodiment described above. The selection circuit 95 compares the condition information of the low-side IGBT 15 and the condition information of the high-side IGBT 25 obtained via the signal transmission circuit 70, thereby selectively outputting one of the condition information of the low-side IGBT 15 and the condition information of the high-side IGBT 25 to the monitor 90 (FIG. 1). In the example described above, the value of the junction temperature of the high-side IGBT 25 and the value of the junction temperature of the low-side IGBT 15 are compared, and the signal indicating the larger value is output to the monitor 90.

The selection circuit 95 includes an input conversion unit 951, a selection unit 952, and an output conversion unit 953. The input conversion unit 951 receives an information output signal indicating the condition information of the high-side IGBT 25. Then, the input conversion unit 951 converts the information output signal into a signal which can be compared with an information output signal indicating the condition information of the low-side IGBT 15. When those signals can be originally compared with each other, the input conversion unit 951 can be omitted. The selection unit 952 compares the value indicated by those signals, thereby selectively outputting the signal indicating one value. For example, two values of the temperature are compared, and only the signal indicating the larger value is output. The output conversion unit 953 converts the signal being output from the selection unit 952 into a signal appropriate to be received by the monitor 90. For example, the signal is converted to a digital signal having a pulse width in accordance with the information or an analog signal having a voltage value in accordance with the information. When the monitor 90 can directly receive the signal being output from the selection unit 952, the output conversion unit 953 can be omitted.

(Effect)

According to the present embodiment, one of the condition information of the low-side IGBT 15 and the condition information of the high-side IGBT 25 can be selectively output. Only the former or latter, which is necessary, can be therefore output. Thus, the load of the signal processing in the monitor 90 can be reduced.

Modification Example

Three or more condition information which can be compared with each other may be detected in the IPM. For example, when the IPM has the three arms AM (FIG. 1) to have the function as the three-phase inverter, three high-side IGBTs and three low-side IGBTs are used. When each junction temperature of those IGBT is detected, six types of condition information in total are detected. In the above case, the selection circuit receives the information output signal indicating the six types of condition information. Then, the selection circuit compares the six types of information, thereby selectively outputting one type of condition information to the monitor 90 (FIG. 1). In the example of detecting the junction temperature, the six values of the junction temperature are compared, and the signal indicating the maximum value is output to the monitor 90.

In the example described above, a signal indicating a maximum value is output from the selection circuit; however, a minimum value may be more important in some cases in view of contents of the detected condition information. In such a case, the selection circuit can be configured to output a signal indicating a minimum value.

According to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood that numerous modifications and variations can be devised without departing from the scope of the invention.

What is claimed is:
1. A semiconductor device, comprising:
a low-side terminal having a low-side potential;
a high-side terminal having a high-side potential different from the low-side potential;
a main output terminal having an intermediate potential;
a low-side switching element being provided between the main output terminal and the low-side terminal;
a low-side drive circuit which drives the low-side switching element and operates using the low-side potential as a reference potential and using a supply potential regulated by an offset voltage from the low-side potential as a power source potential;
a high-side switching element being provided between the main output terminal and the high-side terminal;
a high-side drive circuit which drives the high-side switching element and operates using the intermediate potential as a reference potential and using a floating potential regulated by an offset voltage from the intermediate potential as a power source potential;
a detection circuit using the intermediate potential as a reference potential and detecting condition information of the high-side switching element, thereby outputting a detection signal;
a conversion circuit using the intermediate potential as a reference potential and outputting a conversion signal corresponding to the detection signal from the detection circuit, and
a signal transmission circuit outputting a signal corresponding to the conversion signal from the conversion circuit as a voltage signal using the low-side potential as a reference potential, wherein
the signal transmission circuit includes:
a first point to which the intermediate potential is applied;
a second point to which a referred potential between the low-side potential and the high-side potential is applied, the referred potential being different from the low-side potential and the high-side potential;
a signal switching element having a first end connected to the first point and a second end, and being switched in accordance with the conversion signal; and
a diode being provided between the second point and the second end of the signal switching element and having a direction with which a forward current can flow by a voltage between the first point and the second point in a case where the intermediate potential is the low-side potential.

2. The semiconductor device according to claim 1, wherein
the referred potential is applied using the supply potential.

3. The semiconductor device according to claim 1, wherein
the high-side switching element has a first terminal, a second terminal, and a third terminal and controls an electrical connection between the first terminal and the second terminal in accordance with a voltage applied to the third terminal, and the condition information of the high-side switching element includes information of a voltage applied between the first terminal and the second terminal of the high-side switching element.

4. The semiconductor device according to claim 1, wherein
the detection circuit has a temperature sensor for detecting a temperature of the high-side switching element, and the condition information of the high-side switching element includes information of the temperature of the high-side switching element.

5. The semiconductor device according to claim 1, further comprising
a level-shift circuit transmitting a signal to the high-side drive circuit, the high-side drive circuit and the level-shift circuit being integrated in one semiconductor chip.

6. The semiconductor device according to claim 5, wherein
the diode of the signal transmission circuit is externally attached to the semiconductor chip.

7. The semiconductor device according to claim 5, wherein
the signal switching element of the signal transmission circuit is integrated in the semiconductor chip.

8. The semiconductor device according to claim 1, further comprising
an intermediate potential detection circuit detecting whether the intermediate potential is in a low-state being closer to the low-side potential out of the low-side potential and the high-side potential or in a high-state being closer to the high-side potential out of the low-side potential and the high-side potential, wherein
the conversion circuit starts outputting the conversion signal using, as a trigger, detection by the intermediate potential detection circuit of a transition from the high-state to the low-state.

9. The semiconductor device according to claim 8, wherein
the signal transmission circuit includes a transmission resistance element between the signal switching element and the diode, and the intermediate potential detection circuit is connected between the diode and the transmission resistance element.

10. The semiconductor device according to claim 8, further comprising
a bootstrap circuit generating the floating potential using the supply potential and the intermediate potential, wherein
the intermediate potential detection circuit detects whether or not the bootstrap circuit is performing a charging operation.

11. The semiconductor device according to claim 1, further comprising
a sample and hold circuit being provided between the detection circuit and the conversion circuit, wherein
the sample and hold circuit starts a sample operation at a timing when the high-side switching element is turned on, and starts a hold operation at a timing when the high-side switching element is turned off.

12. The semiconductor device according to claim 1, further comprising:
an output current detection circuit detecting presence of an output current from the main output terminal; and
a peak hold circuit being provided between the detection circuit and the conversion circuit, and performs a peak hold operation when the output current detection circuit detects the presence of the output current.

13. The semiconductor device according to claim 1, further comprising
a selection circuit comparing condition information of the low-side switching element and condition information of the high-side switching element obtained via the signal transmission circuit, thereby selectively outputting one of the condition information of the low-side switching element and the condition information of the high-side switching element.

* * * * *